United States Patent [19]

Maeda et al.

[11] Patent Number: 5,442,226
[45] Date of Patent: Aug. 15, 1995

[54] BIPOLAR TRANSISTOR HAVING AN EMITTER ELECTRODE FORMED OF POLYSILICON

[75] Inventors: Takeo Maeda, Tokyo; Hiroshi Gojohbori, Yokohama; Takeo Nakayama, Kawasaki, all of Japan

[73] Assignee: Kabushiki Kaisha Toshiba, Kawasaki, Japan

[21] Appl. No.: 51,780

[22] Filed: Apr. 26, 1993

[30] Foreign Application Priority Data

Apr. 27, 1992 [JP] Japan ................... 4-107497

[51] Int. Cl.[6] .............. H01L 29/735; H01L 29/417; H01L 29/43
[52] U.S. Cl. ................. 257/557; 257/755; 257/588; 257/751; 257/370
[58] Field of Search ............. 257/377, 378, 556, 557, 257/755, 756, 757, 758, 588, 576, 587, 752, 751, 370

[56] References Cited

U.S. PATENT DOCUMENTS

| | | | |
|---|---|---|---|
| 4,782,380 | 11/1988 | Shankar et al. | 257/751 |
| 4,966,865 | 10/1990 | Welch et al. | 257/752 |
| 4,979,010 | 12/1990 | Brighton | 257/755 |
| 4,980,738 | 12/1990 | Welch et al. | 257/752 |

FOREIGN PATENT DOCUMENTS 0214569  3/1985  Japan ................... 257/557

OTHER PUBLICATIONS

"High-Speed BiCMOS Technology with a Buried Twin Well Structure," T. Ikeda et al., IEEE Transaction on Electron Devices, vol. Ed.-34, No. 6, Jun. 1987, pp. 1304-1310.

Primary Examiner—Robert P. Limanek
Assistant Examiner—David B. Hardy
Attorney, Agent, or Firm—Finnegan, Henderson, Farabow, Garrett & Dunner

[57] ABSTRACT

In a semiconductor device, an emitter electrode has a polysilicon layer provided in a first contact hole and on a first insulating film. The polysilicon layer is in contact with an emitter region and is covered with a metal layer. A second contact hole is provided on a part of a second insulating film located on a substantially flat portion of the metal layer. A third contact hole is provided in those portions of the first insulating film and a second insulating layer which are located on a base region.

10 Claims, 5 Drawing Sheets

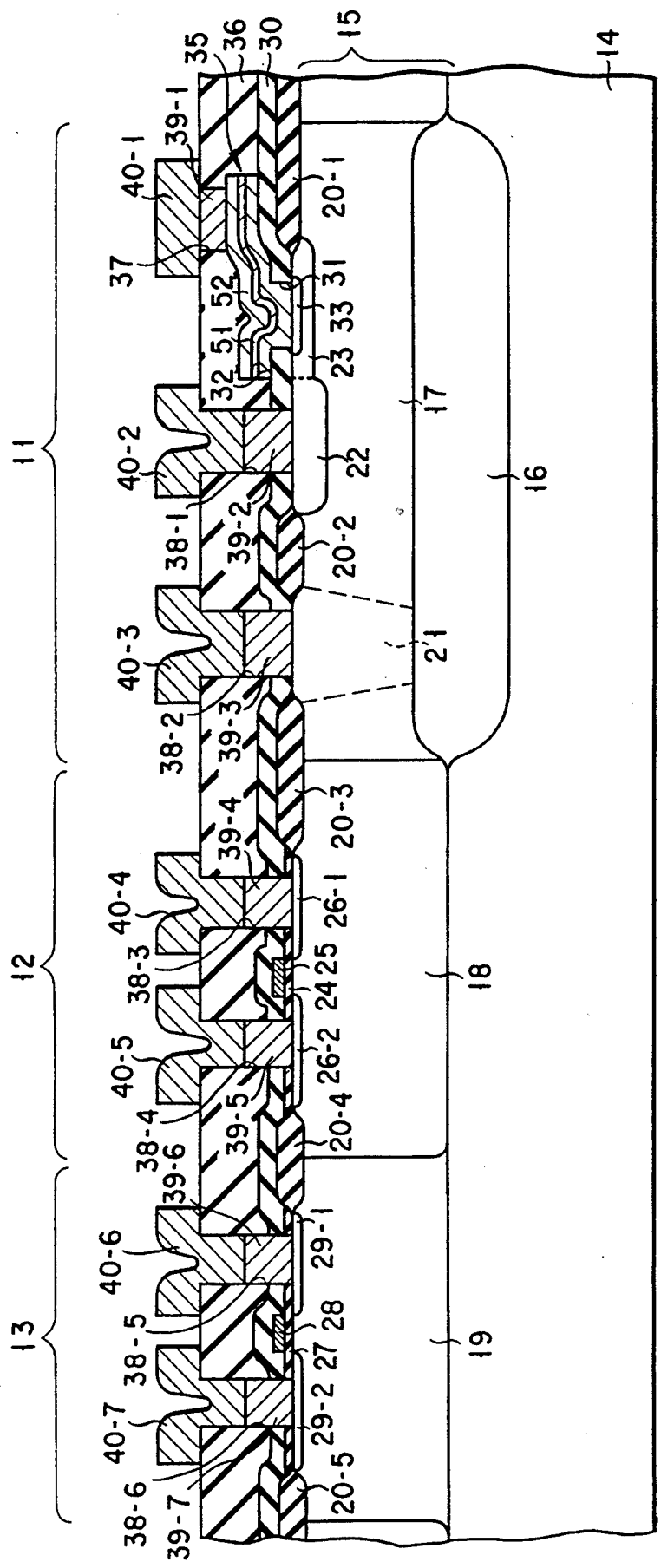
F I G. 3

BIPOLAR TRANSISTOR HAVING AN EMITTER ELECTRODE FORMED OF POLYSILICON

BACKGROUND OF THE INVENTION

1. Field of the Invention

The present invention relates to, e.g. a Bi-CMOS LSI, and more particularly to a semiconductor device including bipolar transistor having an emitter electrode formed by using a polysilicon, and a process of manufacturing the semiconductor device.

2. Description of the Related Art

A semiconductor device including a bipolar transistor, e.g. a Bi-CMOS LSI, employs a bipolar transistor having such a structure that an emitter electrode is formed by using a polysilicon in order to reduce power consumption and enhance integration density and performance. This type of bipolar transistor is disclosed in, e.g., IEEE TRANSACTION ON ELECTRON DEVICES, VOL. ED-34, NO. 6, JUNE 1987 "High-speed Bi-CMOS Technology with a Buried Twin Well Structure" TAKAHIDE IKEDA et al., p. 1304.

In the bipolar transistor, a polysilicon layer containing impurities is formed on part of an inner base region. The polysilicon layer is used as a diffusion source, and impurities are introduced into the inner base region, thereby forming an emitter region. According to this manufacturing process, there can be obtained an emitter region having a less diffusion depth and a smaller size than an emitter region formed by ion implantation. Thus, the depth of the base region can also be reduced. Thereby, a base current and a base resistance can be decreased. Accordingly, the switching speed of the bipolar transistor can be increased and the size thereof can be reduced.

The polysilicon used as the emitter electrode has, in general, a high sheet resistance of, e.g. 200Ω/ . It is desirable, therefore, that a contact portion between an emitter electrode and an aluminum interconnection wire formed on the emitter electrode be located as close as possible to a contact portion between the emitter electrode and an emitter region. The greater the distance therebetween, the higher the emitter resistance. It is most desirable that the two contact portions vertically overlap each other.

In this case, however, it is necessary to arrange the aluminum wire connected to the emitter electrode in the vicinity of the aluminum wire connected to the base region, with a predetermined distance provided therebetween. Thus, the location at which to form the contact portion between the emitter electrode and the associated aluminum wire is limited. As a result, the two contact portions cannot necessarily be located to overlap each other. For the overlapping arrangement of the contact portions, the area of the outer base region must be increased. If the outer base region is enlarged, there occurs a problem that the base capacity of the bipolar transistor increases.

In the technical field of Bi-CMOS LSIs, with the miniaturization of MOS transistors which constitute a CMOS circuit, an electrically conductive material is buried in contact holes for connecting aluminum wiring and active regions such as a source and a drain formed in the semiconductor substrate, in order to improve step coverage. In order to obtain the same step coverage of the bipolar transistor region as the step coverage of the MOS transistor region, it is also desirable to bury an electrically conductive material between the aluminum wiring and the polysilicon layer serving as emitter electrode.

However, if the two contact portions are arranged to overlap each other and the electrically conductive material is deposited on the emitter electrode (polysilicon layer) in the contact hole by means of, e.g. a CVD process, the conductive material grows abnormally at the stepped portion of the polysilicon layer, with the result that a void forms in the vicinity of the stepped portion. Thus, the emitter resistance increases and the electrical characteristics of the bipolar transistor considerably deteriorate.

SUMMARY OF THE INVENTION

An object of the present invention is to provide a semiconductor device wherein an increase in emitter resistance in a bipolar transistor having an emitter electrode formed by using a polysilicon can be prevented and also an increase in base capacitance can be prevented.

Another object of the invention is to provide a process of manufacturing a semiconductor device wherein an increase in emitter resistance in a bipolar transistor having an emitter electrode formed by using a polysilicon can be prevented and also an increase in base capacitance can be prevented.

According to an aspect of the invention, there is provided a semiconductor device comprising: a semiconductor body; a collector region provided in a major surface portion of the semiconductor body, a base region provided in part of a surface portion of the collector region; an emitter region provided in part of a surface portion of the base region; a first insulating film provided on the major surface portion of the semiconductor body; a first contact hole formed in that part of the first insulating film, which is located on the emitter region; an emitter electrode with a structure consisting of at least two layers, including a polysilicon layer provided in the first contact hole and on the first insulating film and put in contact with the emitter region, and a metal layer; a second insulating layer provided on the emitter electrode and the first insulating film; a second contact hole provided, remotely from the first contact hole, on that part of the second insulating film which is located on a substantially flat portion of the metal layer; a first buried metal layer provided on said metal layer in the second contact hole; a first wiring layer provided on the first buried metal layer and on part of the second insulating layer; a third contact hole provided in those portions of the first and second insulating films which are located on the base region; a second buried metal layer formed on the base region in the third contact hole; and a second wiring layer provided on the second buried metal layer and on part of the second insulating film.

According to this structure, the metal layer with sufficiently low resistance is provided on the polysilicon layer. Thus, the emitter resistance can be reduced even if the contact portion between the emitter electrode and emitter region is located remote from the contact portion between the emitter electrode and wiring layer. Since the position of the contact portion between the emitter electrode and wiring layer can be freely chosen, the second contact hole can be formed on the substantially flat portion of the metal layer while the distance between itself and the wiring layer connected to the base region is maintained. Thus, the size of the base region can be reduced, and the base capacity is not increased. Furthermore, since the buried metal layer can be formed on the flat metal layer, no void forms due to abnormal growth of the metal layer, and an increase in emitter resistance can be prevented.

According to another aspect of the invention, there is provided a process of manufacturing a semiconductor device, comprising the steps of: forming a collector region in a major surface portion of a semiconductor body; forming a base region in part of a surface portion of the collector region; forming a first insulating film on the major surface portion of the semiconductor body; forming a first contact hole in that part of the first insulating film, where an emitter region is to be formed; forming an emitter electrode with a structure consisting of at least two layers, including a polysilicon layer provided in the first contact hole and on part of the first insulating film, and a metal layer; forming the emitter region by introducing impurities into the base region from the polysilicon layer as a diffusion source via the first contact hole; forming a second insulating layer on the emitter electrode and on part of the first insulating film; forming a second contact hole, remotely from the first contact hole, in that part of the second insulating film which is located on a substantially flat portion of the metal layer; forming a third contact hole in those portions of the first and second insulating films which are located on the base region; forming a first buried metal layer on said metal layer in the second contact hole, and forming a second buried metal layer on said base region in the third contact hole; and forming first and second wiring layers on the first and second buried metal layers and on part of the second insulating film.

According to this process, since there is provided the step of forming the metal layer with sufficiently low resistance on the polysilicon, the emitter resistance can be reduced even if the contact portion between the emitter electrode and the emitter region is located remote from the contact portion between the emitter electrode and wiring layer. Since the second contact hole is formed on the substantially flat surface of the metal layer and the first buried metal layer is formed on the metal layer, abnormal growth due to stepped portion can be prevented. Therefore, an increase in emitter resistance can be prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3 to 5 are cross-sectional views showing semiconductor devices according to second to fourth embodiments of the invention, and specifically showing bipolar transistors, N-channel MOS transistors and P-channel MOS transistors in Bi-CMOS LSIs.

DETAILED DESCRIPTION OF THE PREFERRED EMBODIMENTS

Figure 1:
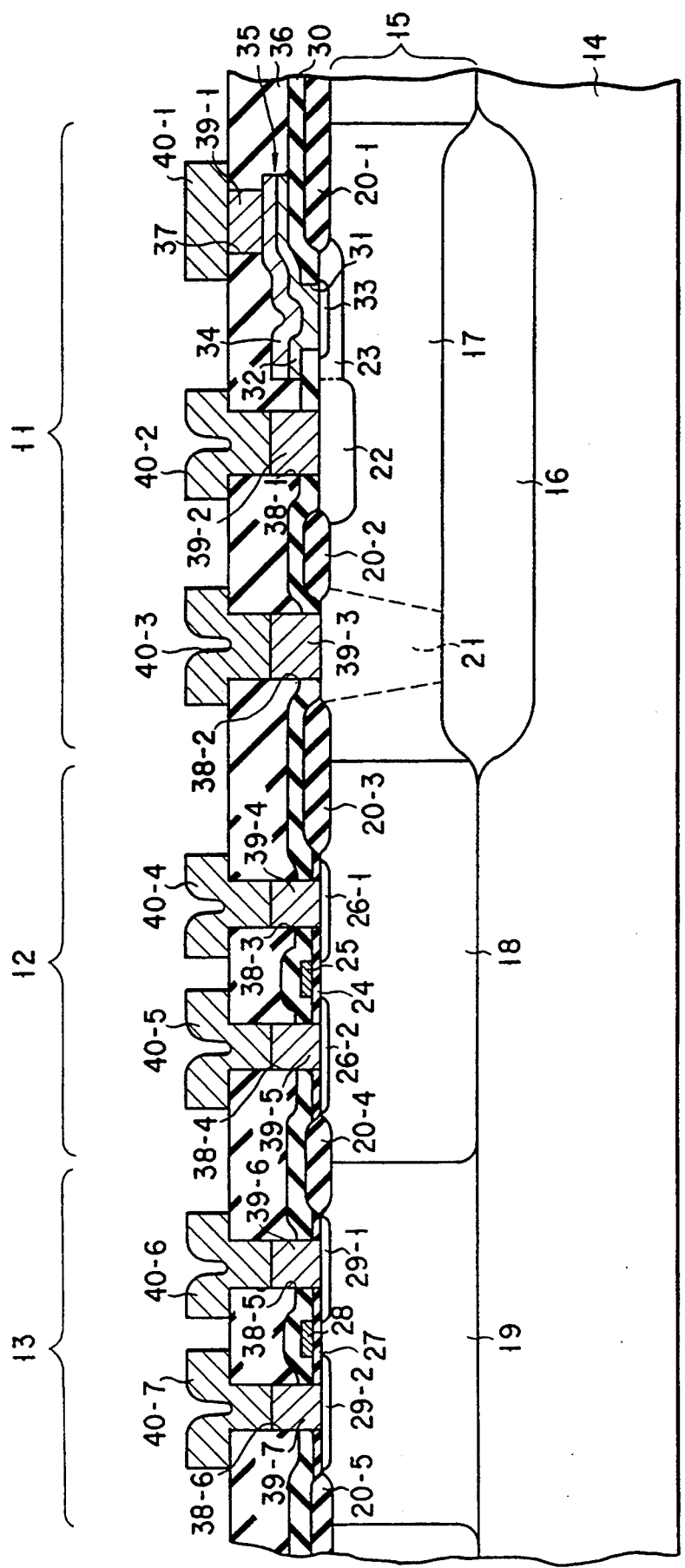
FIG. 1 is a cross-sectional view showing a semiconductor device according to a first embodiment of the invention, and specifically showing a bipolar transistor, an N-channel MOS transistor and a P-channel MOS transistor in a Bi-CMOS LSI.

FIG. 1 is a cross-sectional view showing a semiconductor device according to a first embodiment of the invention. Specifically, FIG. 1 shows representatively a bipolar transistor 11, an N-channel MOS transistor 12 and a P-channel MOS transistor 13 in a Bi-CMOS LSI.

The Bi-CMOS LSI is formed in the following manufacturing process. N-type impurities are implanted in a major surface portion of a P-type silicon substrate 14. An N-type epitaxial layer 15 having a thickness of about 1.2 $\mu$m is formed on the substrate 14 by means of an epitaxial growth process. When the epitaxial layer 15 is formed, the N-type impurities are diffused in the substrate 14 and epitaxial layer 15 in the vicinity of the boundary between the substrate 14 and the epitaxial layer 15, thereby forming an N+-type buried layer 16. That portion of the epitaxial layer 15 located on the buried layer 16 serves as collector region 17. The impurity concentration of the collector region 17 can be determined by controlling the quantity of N-type impurities in a reaction gas at the time of epitaxial growth. Alternatively, N-type impurities may be ion-implanted in that portion of the epitaxial layer 15 which corresponds to the collector region 17. A P-well region 18 and an N-well region 19 each having an impurity concentration of about $1 \times 10^{17}/cm^3$ are formed in those portions of the epitaxial layer 15, at which the MOS transistors 12 and 13 are to be formed. The epitaxial layer 15 may be used as the N-well region 19 without any processing, but it is possible to ion-implant N-type impurities in the epitaxial layer 15 to determine the impurity concentration, where necessary.

Field oxide films 20-1 to 20-5 each having a thickness of about 6000Å are formed on the surface of the epitaxial layer 15 by means of a LOCOS process. N-type impurities are ion-implanted in the collector region 17, with the field oxide film 20-2 and 20-3 used as masks, thus forming an N+-type collector lead-out region 21. P-type impurities are ion-implanted in that portion of the collector region 17 which is located between the field oxide films 20-1 and 20-2, thus forming a P+-type outer base region 22 and P−-type inner base region 23. The depth of the diffused inner base region 23 is less than that of the outer base region 22.

Gate oxide films 24 and 27 are formed on the surfaces of the P-well region 18 and the N-well region 19 by means of, e.g. thermal oxidation. Gate electrodes 25 10 and 28 each having a gate length of 0.5 $\mu$m are formed on the gate oxide films 24 and 27. The gate electrodes 25 and 28 are formed by forming, e.g. polysilicon layers on the gate oxide films 24 and 27 and then patterning the polysilicon layers by means of a photoetching process.

N-type impurities are ion-implanted by using the gate electrode 25 and field oxide films 20-3 and 20-4 as masks, thereby forming a source region 26-1 and a drain region 26-2 in the p-well region 18 when the source and drain regions 26-1 and 26-2 are formed, the areas where the P-channel MOS transistor 13 and bipolar transistor 11 are to be formed are masked.

P-type impurities are ion-implanted by using the gate electrode 28 and field oxide films 20-4 and 20-5 as masks, thereby forming a source region 29-1 and a drain region 29-2 in the N-well region 19.

When the P-channel MOS transistor 13 is formed, the areas where the N-channel MOS transistor 12 and bipolar transistor 11 are to be formed are masked.

A first interlayer insulating film 30 having a thickness of 3000Å is formed on the resultant semiconductor structure. A contact hole 31 is formed in that portion of the first interlayer insulating film 30 which is located on the inner base region 23. A polysilicon layer 32 having a thickness of 1000Å is deposited in the contact hole 31 and on that part of the first interlayer insulating film 30 which surrounds the hole 31. Then, arsenic (As) impurities are ion-implanted in the polysilicon layer 32 to form an emitter region. Subsequently, heat treatment is performed and As is diffused from the polysilicon layer 32 into the inner base region 23, thereby forming an $N^+$-type emitter region 33. The heat treatment for forming the emitter region 33 is not necessary in the case where heat treatment is performed in a later process or reflow is performed to flatten the interlayer insulating film. Thereafter, a silicide layer 34 having a thickness of 2000Å is deposited on the polysilicon layer 32. The silicide layer 34 and polysilicon layer 32 are etched by a photoetching process, thereby forming a double layer emitter electrode 35. The emitter electrode 35 is electrically connected to the emitter region 33 via the contact hole 31.

A second interlayer insulating film 36 having a thickness of 8000Å is formed on the emitter electrode 35 and first interlayer insulating film 30. A contact hole 37 having a width of about 0.6 to 0.7 $\mu$m is formed by RIE in that part of the interlayer insulating film 36 which is located on the emitter electrode 35. The contact hole 37 is remote from the region above the contact hole 31 and is formed on a substantially flat portion of the emitter electrode 35 (silicide layer 34). In addition, contact holes 38-1 to 38-6 are formed by RIE on those portions of the first and second interlayer insulating films 30 and 36, which are located on the outer base region 22, collector lead-out region 21, source and drain regions 26-1 and 26-2 of the N-channel MOS transistor 12, and source and drain regions 29-1 and 29-2 of the P-channel MOS transistor 13. The area of the bottom of each of the contact hole 37 and 38-1 to 38-6 is 1.0 $\mu m^2$ or less.

Metal layers 39-1 to 39-7 of tungsten, etc. are selectively grown by, e.g. an LPCVD process, in the contact holes 37 and 38-1 to 38-6. Aluminum is deposited on the interlayer insulating film 36 and in contact holes 37 and 38-1 to 38-6 and patterned to form aluminum interconnection wires 40-1 to 40-7. Thereby, the aluminum wire 40-1 is electrically connected to the emitter electrode 35 via the buried metal 39-1 in the contact hole 37. The aluminum wire 40-2 is electrically connected to the outer base region 22 via the buried metal 39-2 in the contact hole 38-1. The aluminum wire 40-3 is electrically connected to the collector lead-out region 21 via the buried metal 39-3 in the contact hole 38-2. The aluminum wires 40-4 and 40-5 are electrically connected, respectively, to the source and drain regions 26-1 and 26-2 via the buried metal layers 39-4 and 39-5 in the contact holes 38-3 and 38-4. The aluminum wires 40-6 and 40-7 are electrically connected, respectively, to the source and drain regions 29-1 and 29-2 via the buried metal layers 39-6 and 39-7 in the contact holes 38-5 and 38-6.

By the above-described manufacturing process, the bipolar transistor 11, N-channel MOS transistor 12 and P-channel MOS transistor 13 are formed in the Bi-CMOS LSI.

As is clear from FIG. 1, the contact portion (contact hole 37) between the emitter electrode 35 and buried metal layer 39-1 is not located above the contact portion (contact hole 31) between the emitter electrode 35 and emitter region 33, and the metal layer 39-1 can be formed on the substantially flat portion of the silicide layer 34. Accordingly, abnormal growth of the metal layer 39-1 at the time of the CVD process can be prevented, and the metal layer 39-1 can be uniformly formed with no void. As a result, an increase in emitter resistance can be prevented and a deterioration of characteristics such as switching speed of the bipolar transistor can be prevented.

The emitter electrode 35 has a double layer structure comprising the polysilicon layer 32 and silicide layer 34. The upper layer of the emitter electrode 35 is the silicide layer 34 having a sufficiently low resistance, and the lower layer thereof is the polysilicon layer 32 which has a high resistance and is indispensable for the emitter region 33. Thus, even if the two contact portions (contact holes 37 and 31) are not situated to vertically overlap each other, the emitter resistance can be decreased by virtue of the silicide layer 34 having a low sheet resistance. From this viewpoint, too, an increase in emitter resistance due to the sheet resistance of the polysilicon layer 32 can be prevented. By virtue of the double layer structure of the emitter electrode 35 according to the first embodiment, the emitter resistance can be decreased to 20$\Omega$ or less, even in the case of the Bi-CMOS LSI manufactured on the basis of design rules in which the width of each of the contact holes 31, 37 and 38-1 to 38-6 is set at 0.8$\mu$ or less.

The width of the base region of the bipolar transistor in the semiconductor device of the present invention and the width of a base region of the bipolar transistor in a conventional semiconductor device will now be described in detail with reference to FIGS. 2A and 2B.

Figure 2A:
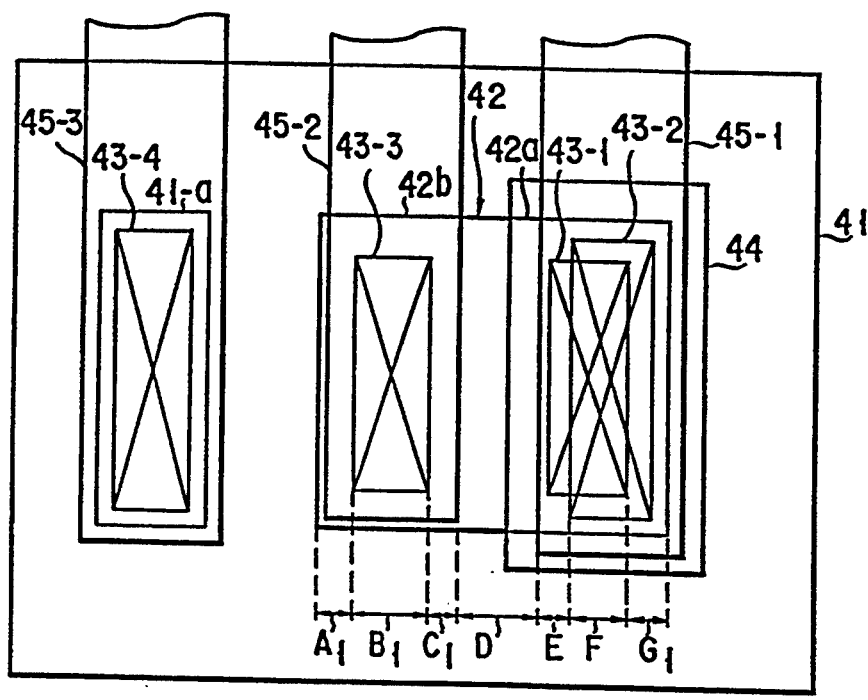
FIG. 2A is a plan view showing an example of the pattern structure of a conventional bipolar transistor.

FIG. 2A is a plan view showing an example of the pattern structure of the conventional bipolar transistor. A base region 42 is formed in a collector region 41. The base region 42 comprises an inner base region 42a and an outer base region 42b. A contact hole 3-1 is formed in a first interlayer insulating film (not shown) formed on the inner base region 42a. An emitter electrode (polysilicon layer) 44 is formed in the contact hole 43-1 and on that part of the first interlayer insulating film which surrounds the contact hole 43-1. A contact hole 43-2 is formed in a second interlayer insulating film (not shown) formed on the emitter electrode 44. An aluminum interconnection wire 45-1 is electrically connected to the emitter electrode 44 via the contact hole 43-2. A contact hole 43-3 is formed in those portions of the first and second interlayer insulating films which are located on the outer base region 42b. An aluminum wire 45-2 is electrically connected to the outer base region 42b via the contact hole 43-3. A contact hole 43-4 is formed in those portions of the first and second interlayer insulating films which are located on a collector lead-out region 41a of the collector region 41. An aluminum wire 45-3 is electrically connected to the collector lead-out region 41a via the contact hole 43-4.

In the above pattern structure, it is necessary to determine a distance $A_1$ of 0.3 μm as a margin for a field oxide film in forming the contact hole 43-3. A width $B_1$ of the contact hole 43-3 is 0.7 μm. It is also necessary to determine a distance $C_1$ of about 0.2 μm as a margin for the contact hole 43-3 in forming the aluminum wire 45-2. A margin D for the aluminum wire 45-2 in forming the aluminum wire 45-1 needs to be 0.8 μm. A margin E for the contact hole 43-2 in forming the aluminum wire 45-1 is 0.2 μm. A width F of an overlapping portion of the contact holes 43-1 and 43-2 is 0.7 μm, and a margin $G_1$ for a field oxide film in forming the contact hole 43-1 is 0.5 μm. Accordingly, the width of the base region 42 in the conventional bipolar transistor is "$A_1+B_1+C_1+D+E+F+G_1=3.4$ μm."

Figure 2B:
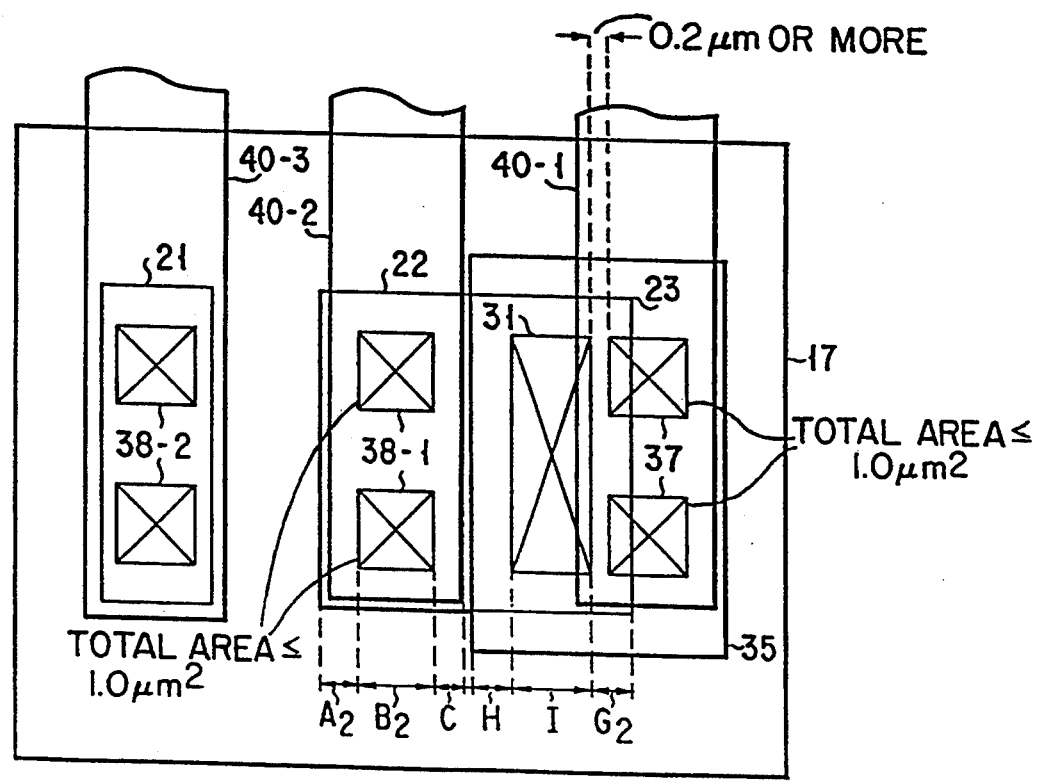
FIG. 2B is a plan view showing an example of the pattern structure of a bipolar transistor section in the Bi-CMOS LSI shown in FIG. 1.

FIG. 2B is a plan view showing the pattern of the bipolar transistor 11 shown in FIG. 1. In FIG. 2B, the parts common to those shown in FIG. 1 are denoted by like reference numerals. The inner base 23 and outer base 22 are formed in the collector region 17. The contact hole 31 is formed in the first interlayer insulating film 30 (not shown in FIG. 21; see FIG. 1) formed on the inner base region 23. The emitter electrode (polysilicon layer 32 and silicide layer 34) is formed in the contact hole 31 and on that part of the first interlayer insulating film 30 which surrounds the contact hole 31. The contact hole 37 is formed in the second interlayer insulating film 36 (not shown in FIG. 2; see FIG. 1) formed on the emitter electrode 35. The buried metal layer 39-1 is formed in the contact hole 37. The aluminum interconnection wire 40-1 is electrically connected to the emitter electrode 35 via the metal layer 39-1 in the contact hole 37. The contact hole 38-1 is formed in those portions of the first and second interlayer insulating films 30 and 36 which are located on the outer base region 22. The metal layer 39-2 is buried in the contact hole 38-1. The aluminum wire 40-2 is electrically connected to the outer base region 22 via the contact hole 38-1. The contact hole 38-2 is formed in those portions of the first and second interlayer insulating films 30 and 36 which are located on the collector lead-out region 21 in the collector region 17. The metal layer 39-3 is buried in the contact hole 38-2. The aluminum wire 40-3 is electrically connected to the collector lead-out region 21 via the contact hole 38-2.

In the above pattern structure, it is necessary to determine a distance $A_2$ of about 0.3 μm as a margin for the field oxide film 20-4 in forming the contact hole 38-1. A width $B_2$ of the contact hole 38-1 is 0.7 μm. It is also necessary to determine a distance $C_2$ of 0.2 μm as a margin for the contact hole 38-1 in forming the aluminum wire 40-2. A margin H for the contact hole 31 in forming the emitter electrode 35 is 0.4 μm. A width I of the contact hole 31 is 0.5 μm. A margin $G_2$ for the field oxide film 20-5 in forming the contact hole 31 is 0.5 μm. Thus, in the pattern structure shown in FIG. 2B, the distance between the contact hole 31 and contact hole 37 needs to be 0.2 μm or more. Accordingly, the width of the base regions 22 and 23 in the bipolar transistor of the present invention is "$A_2+B_2+C_2+H+I+G_2=2.9$ μm."

As has been described above, in the conventional bipolar transistor, the contact hole 43-2 is situated above the contact hole 43-1. Consequently, the width of the outer base region 42b is limited by the required distance D between the aluminum wire 45-1 and aluminum wire 45-2, i.e. the pitch between the aluminum wires 45-1 and 45-2, and must be made greater than the width capable of patterning. By contrast, in the bipolar transistor of the present invention, the emitter resistance is decreased by providing the silicide layer 34, and there is no need to form the contact hole 31 above the contact hole 37. The contact holes 31 and 37 are located remote from each other. Unlike the conventional bipolar transistor, there is no need to enlarge the outer base region so as to match with the pitch of the aluminum wires. Accordingly, the outer base region 22 can be reduced and the base capacity can be decreased. Specifically, as described above, the width of the base regions 22 and 23 can be reduced to 2.9 μm from 3.4 μm of the conventional device. As a result, the base capacity can be decreased by about 17%.

FIG. 3 is a cross-sectional view showing a semiconductor device according to a second embodiment of the invention. Like FIG. 1, FIG. 3 shows representatively a bipolar transistor 11, an N-channel MOS transistor 12 and a P-channel MOS transistor 13 in a Bi-CMOS LSI. In the first embodiment, the emitter electrode 35 has the double layer structure comprising the polysilicon layer 32 and silicide layer 34. In the second embodiment, an emitter electrode 35 has a three layer structure comprising a polysilicon layer 32, a barrier metal layer 51 of TiN, WN, MoN, etc., and a high-melting-point metal layer 52 of W, Mo, Ti, Ni, etc. In the case of forming the emitter electrode 35 of the three layer structure, the same process as in the first embodiment is performed to form the polysilicon layer 32, ion-implant As in the polysilicon layer 32 and form the N+-type emitter region 33. Subsequently, the barrier metal layer 51 of TiN, WN, MoN, etc. is formed on the polysilicon layer 32. The high-melting-point metal layer 52 of W, Mo, Ti, Ni, etc. is formed on the barrier metal layer 51. The high-melting-point metal layer 52, barrier metal layer 51 and polysilicon layer 32 are etched by a photoetching process, thus forming the three-layer emitter electrode 35. The subsequent steps of the manufacturing process are the same as in the first embodiment.

Figure 4:
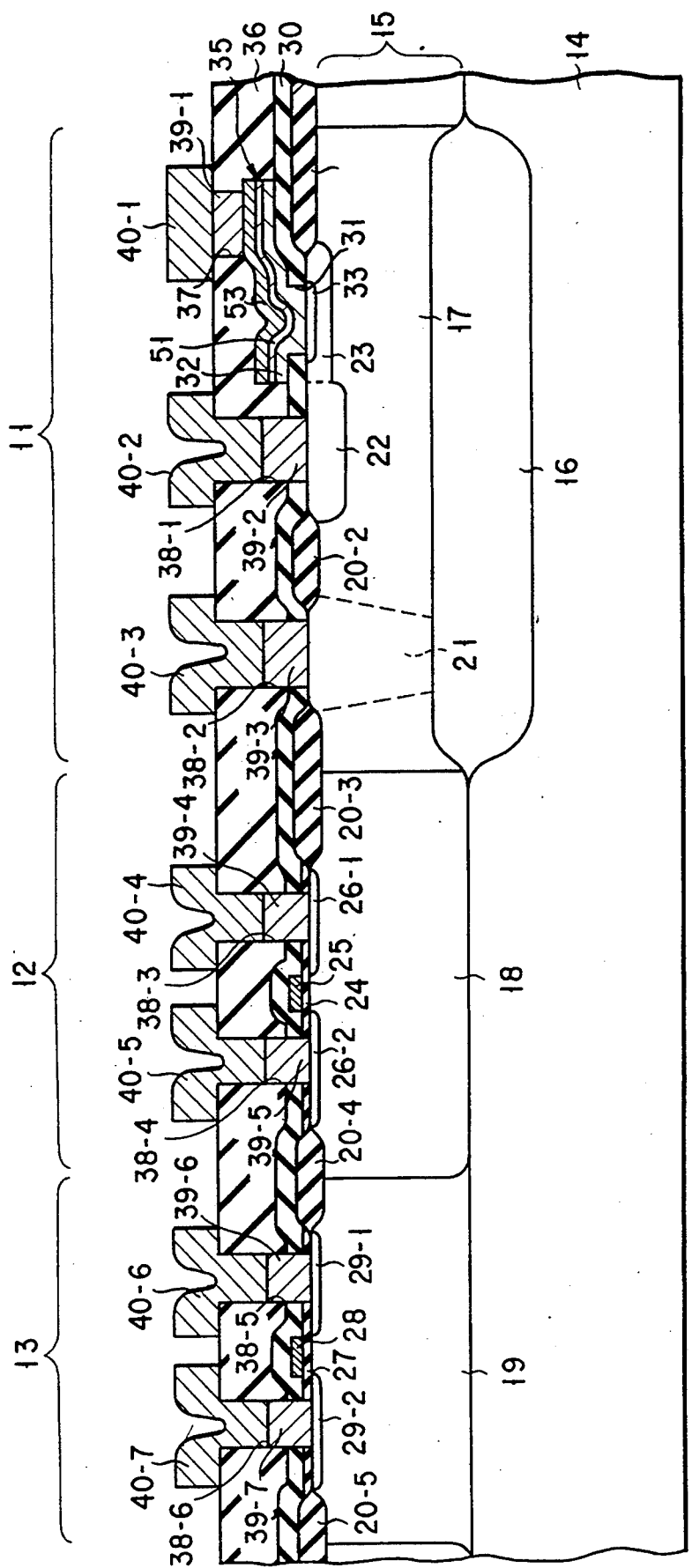

As is shown in FIG. 4, the emitter electrode 35 may have a three layer structure comprising a polysilicon layer 32, a barrier metal layer 51 of TiN, WN, MoN, etc., and a polycide layer 53. In this case, the barrier metal layer 51 is formed in the same manner as in the second embodiment, and then the polycide layer 53 is formed. The polycide layer 53, barrier metal layer 51 and polysilicon layer 32 are etched by a photoetching process, thereby forming the three-layer emitter electrode 35. The subsequent steps of the manufacturing process are the same as in the first and second embodiments.

Figure 5:
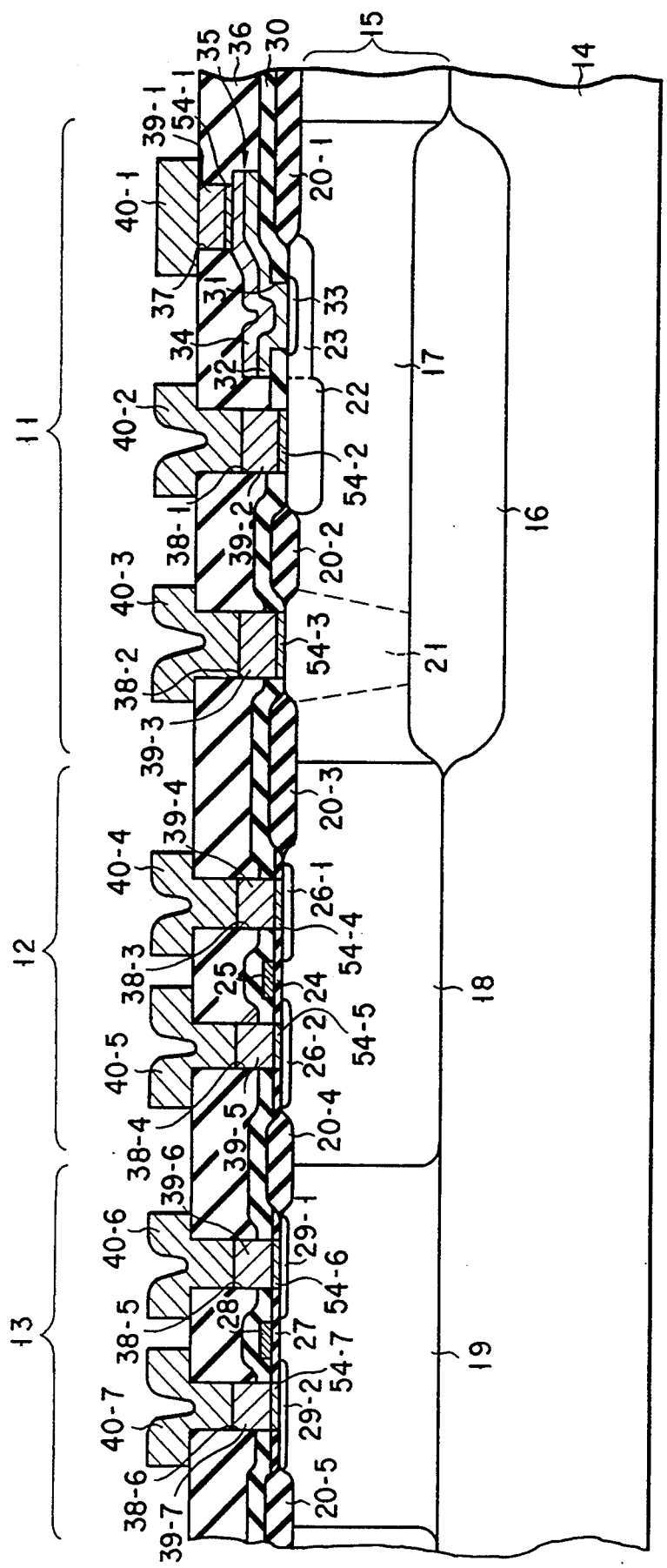

In the first embodiment, tungsten is used as material of the buried metal layers 39-1 to 39-7. Tungsten may be replaced with Ti, Ni, Mo or Si. In addition, different kinds of materials may be laminated. For example, as is shown in FIG. 5, barrier metal layers 54-1 to 54-7 of TiN, WN, MoN, etc. may be interposed between the metal layers 39-1 to 39-7 and the emitter electrode 35, outer base region 22, collector lead-out region 21, source and drain regions 26-1 and 26-2 of the N-channel MOS transistor 12, and source and drain regions 29-1 and 29-2 of the P-channel MOS transistor 13. When the buried metal layers of the two layer structure are formed, the contact holes 37 and 38-1 to 38-6 are formed by RIE in the second and first interlayer insulating films 36 and 30, as in the first embodiment, and then the barrier metal layers 54-1 to 54-7 are formed in the contact holes 37 and 38-1 to 38-6. Subsequently, the metal layers 39-1 to 39-7 of tungsten, etc. are formed on the barrier metal layers 54-1 to 54-7 in the contact holes 37 and 38-1 to 38-6. Aluminum is deposited on the interlayer insulating film 36 and in the contact holes 37 and 38-1 to 38-6 and is patterned to form aluminum interconnection wires 40-1 to 40-7.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a semiconductor body;
   a collector region provided in a major surface portion of the semiconductor body;
   a base region provided in part of a surface portion of the collector region;
   an emitter region provided in part of a surface portion of the base region;
   a first insulating film provided on the major surface portion of the semiconductor body;
   a first contact hole formed in a part of the first insulating film, which is located on the emitter region;
   an emitter electrode with a structure consisting of at least two layers, including a polysilicon layer provided in the first contact hole and on the first insulating film and put in contact with the emitter region, and a metal layer covering a full surface of the polysilicon layer;
   a second insulating layer provided on the emitter electrode and the first insulating film;
   a second contact hole provided, remotely from the first contact hole, on that part of the second insulating film which is located on a substantially flat portion of the metal layer;
   a first buried metal layer provided on said metal layer in the second contact hole;
   a first wiring layer provided on the first buried metal layer and on part of the second insulating layer;
   a third contact hole provided in those portions of the first insulating film and the second insulating layer which are located on the base region;
   a second buried metal layer formed on the base region in the third contact hole; and
   a second wiring layer provided on the second buried metal layer and on part of the second insulating layer.

2. The semiconductor device according to claim 1, wherein each of the first and second buried metal layers is formed of at least one selected from the group consisting of at least one selected from the group consisting of W, Ti, Ni, Mo, and Si.

3. The semiconductor device according to claim 1, wherein each of the first and second buried metal layers has a lamination structure including at least a metal selected from the group consisting of W, Ti, Ni, Mo, and Si.

4. The semiconductor device according to claim 1, wherein a distance between nearest sides of the first contact hole and the second contact hole is 0.2 $\mu$m or more.

5. The semiconductor device according to claim 1, wherein an area of a bottom of each of the second and third contact holes is 1.0 $\mu$m or less.

6. The semiconductor device according to claim 1, wherein said metal layer is a silicide layer.

7. The semiconductor device according to claim 1, further comprising a barrier metal layer provided between the polysilicon layer and the metal layer.

8. The semiconductor device according to claim 1, wherein said metal layer has a lamination structure comprising a high-melting-point metal layer and a barrier metal layer.

9. The semiconductor device according to claim 8, wherein said high-melting-point metal layer is formed of one selected from the group consisting of W, Mo, Ti, and Ni, and said barrier metal layer is formed of one selected from the group consisting of TiN, WN, and MoN.

10. The semiconductor device according to claim 1, wherein the first contact hole is located between the second contact hole and the third contact hole.

* * * * *